US012661665B2

(12) United States Patent
Chen et al.

(10) Patent No.: US 12,661,665 B2
(45) Date of Patent: Jun. 23, 2026

(54) NOZZLE

(71) Applicant: Brillian Network & Automation Integrated System Co., Ltd., Miaoli County (TW)

(72) Inventors: Yung-Chou Chen, Miaoli County (TW); Sheng-Chi Hsu, Miaoli County (TW); Yi-Jun Gu, Miaoli County (TW); Chi-Hao Lin, Miaoli County (TW)

(73) Assignee: Brillian Network & Automation Integrated System Co., Ltd., Miaoli County (TW)

( * ) Notice: Subject to any disclaimer, the term of this patent is extended or adjusted under 35 U.S.C. 154(b) by 825 days.

(21) Appl. No.: 17/949,173

(22) Filed: Sep. 20, 2022

(65) Prior Publication Data

US 2024/0009686 A1      Jan. 11, 2024

(30) Foreign Application Priority Data

Jul. 8, 2022     (TW) .................................. 111125633

(51) Int. Cl.
        *B05B 1/00*          (2006.01)
        *B05B 15/18*         (2018.01)
        *H01L 21/673*        (2006.01)
(52) U.S. Cl.
        CPC ........ *B05B 1/005* (2013.01); *H01L 21/67389* (2013.01); *B05B 15/18* (2018.02)

(58) Field of Classification Search
        CPC ....... B05B 1/005; B05B 15/18; B05B 7/0815; B05B 7/0892; B05B 7/065; H01L 21/67389

(Continued)

(56) References Cited

U.S. PATENT DOCUMENTS 4,917,300 A * 4/1990 Gloviak ................ B05B 7/0815
                                                       239/296
5,732,885 A * 3/1998 Huffman ............... B05B 7/0475
                                                       239/548

(Continued)

FOREIGN PATENT DOCUMENTS

TW           M549449 U  *  9/2017
TW           M609936 U      4/2021

*Primary Examiner* — Kevin Edward Schwartz
(74) *Attorney, Agent, or Firm* — Li & Cai Intellectual Property Office

(57)          ABSTRACT
A nozzle is provided and includes a carrying segment, an assembling segment, a conical frustum segment, and at least one ring-shaped rib formed on the carrying segment and surrounding the conical frustum segment. The carrying segment has a top side and an opposite bottom side. The assembling segment is formed by extending from the bottom side of the carrying segment. The conical frustum segment is formed to taper from the top side of the carrying segment in a direction away from the assembling segment. The conical frustum segment defines a central axis, and a surrounding lateral surface of the conical frustum segment and a plane perpendicular to the central axis have an angle therebetween that is within a range from 35 degrees to 70 degrees. The conical frustum segment, the carrying segment, and the assembling segment jointly define an airflow channel penetrating therethrough along the central axis.

16 Claims, 15 Drawing Sheets

(58) Field of Classification Search
USPC ..................................... 239/390, 290, 296, 8
See application file for complete search history.

(56) References Cited

U.S. PATENT DOCUMENTS

| | | | | |
|---|---|---|---|---|
| 6,267,301 | B1 * | 7/2001 | Haruch | ................. B05B 7/0892 |
| | | | | 239/290 |
| 6,349,887 | B1 * | 2/2002 | Pyo | ..................... C23C 16/4481 |
| | | | | 239/137 |
| 7,163,160 | B2 * | 1/2007 | Liu | ....................... B05B 7/0815 |
| | | | | 239/428 |
| 2005/0284568 | A1 * | 12/2005 | America | ............. H01L 21/6708 |
| | | | | 156/345.33 |
| 2008/0217262 | A1 * | 9/2008 | Van Rijn | ................... B05B 1/14 |
| | | | | 210/220 |
| 2014/0041755 | A1 * | 2/2014 | Chou | ................ H01L 21/67393 |
| | | | | 141/113 |
| 2018/0290160 | A1 * | 10/2018 | Haruch | ................. B05B 7/0861 |
| 2020/0061677 | A1 * | 2/2020 | Nakano | ...................... B08B 3/12 |
| 2021/0379612 | A1 * | 12/2021 | Volk | ......................... B05B 1/14 |
| 2022/0016651 | A1 * | 1/2022 | Oikawa | ............ H01L 21/67034 |
| 2022/0395843 | A1 * | 12/2022 | Bilger | .................. B05B 12/088 |

* cited by examiner

NOZZLE

CROSS-REFERENCE TO RELATED PATENT APPLICATION

This application claims the benefit of priority to Taiwan Patent Application No. 111125633, filed on Jul. 8, 2022. The entire content of the above identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to a nozzle, and more particularly to a nozzle applied to a wafer cassette or a mask cassette.

BACKGROUND OF THE DISCLOSURE

Gas in a wafer cassette or a mask cassette can be exchanged by disposing the wafer cassette or the mask cassette on nozzles of a load port, such that the wafer cassette or the mask cassette can be filled with relatively stable gas. When the gas in the wafer cassette or the mask cassette is exchanged through the load port, how to avoid gas leakage from the nozzles has become one of the aims for structural improvement of the conventional nozzles.

SUMMARY OF THE DISCLOSURE

In response to the above-referenced technical inadequacies, the present disclosure provides a nozzle to effectively improve on the issues associated with conventional nozzles.

In one aspect, the present disclosure provides a nozzle, which includes a carrying segment, an assembling segment, a conical frustum segment, and at least one ring-shaped rib. The carrying segment has a top side and a bottom side that is opposite to the top side. The assembling segment extends from the bottom side of the carrying segment. The conical frustum segment is tapered from the top side of the carrying segment along a direction away from the assembling segment. The conical frustum segment defines a central axis, and a surrounding lateral surface of the conical frustum segment and a plane perpendicular to the central axis have an angle therebetween that is within a range from 35 degrees to 70 degrees. The at least one ring-shaped rib is formed on the top side of the carrying segment and surrounds the conical frustum segment. The conical frustum segment, the carrying segment, and the assembling segment jointly define an airflow channel penetrating therethrough along the central axis.

Therefore, the conical frustum segment of the nozzle provided by the present disclosure can be engaged into a gas hole of a wafer cassette or a mask cassette through specific structural conditions (e.g., the angle being within a range from 35 degrees to 70 degrees), such that the surrounding lateral surface of the conical frustum segment is tightly abutted against an inner wall surrounding the gas hole for preventing gas leakage from the nozzle. Accordingly, the airtight effect between the nozzle and the wafer cassette (or the mask cassette) can be effectively improved. Furthermore, gas leakage from the nozzle can be effectively avoided because of the synergy of the conical frustum segment and the at least one ring-shaped rib provided by the present disclosure.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The described embodiments may be better understood by reference to the following description and the accompanying drawings, in which.

DETAILED DESCRIPTION OF THE EXEMPLARY EMBODIMENTS

Figure 1:
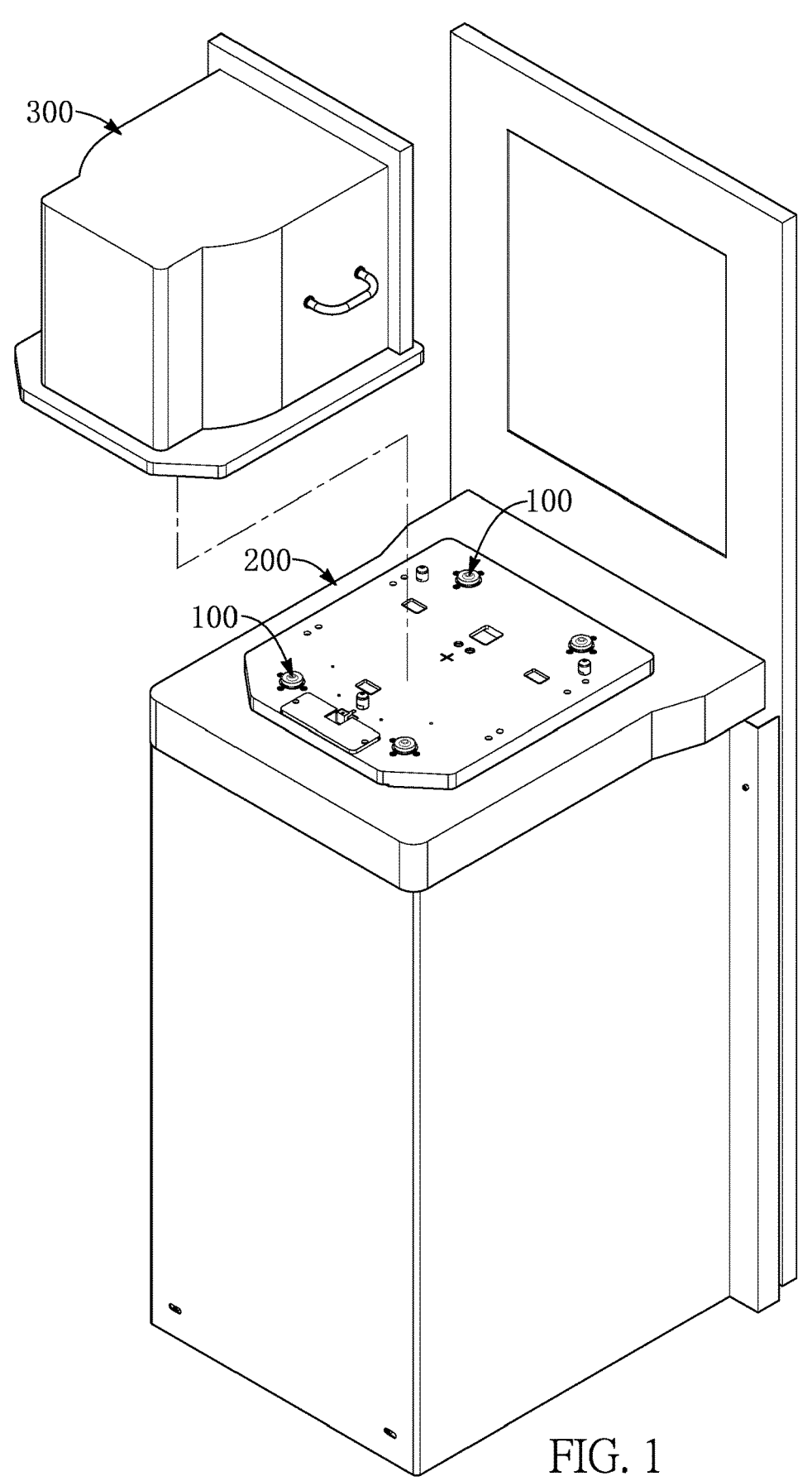
FIG. 1 is a perspective view showing nozzles that are assembled to a load port for carrying a wafer cassette according to a first embodiment of the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

First Embodiment

Referring to FIG. 1 to FIG. 6, a first embodiment of the present disclosure provides a nozzle 100. As shown in FIG. 1 to FIG. 4, the nozzle 100 of the present embodiment is provided for being assembled to a load port 200 that is capable of carrying a wafer cassette 300. The nozzle 100 in the present embodiment has an inherently one-piece structure made of a polymer material (e.g., a silicone) and has a Shore hardness preferably within a range from 18 to 22, but the present disclosure is not limited thereto.

Figure 5:
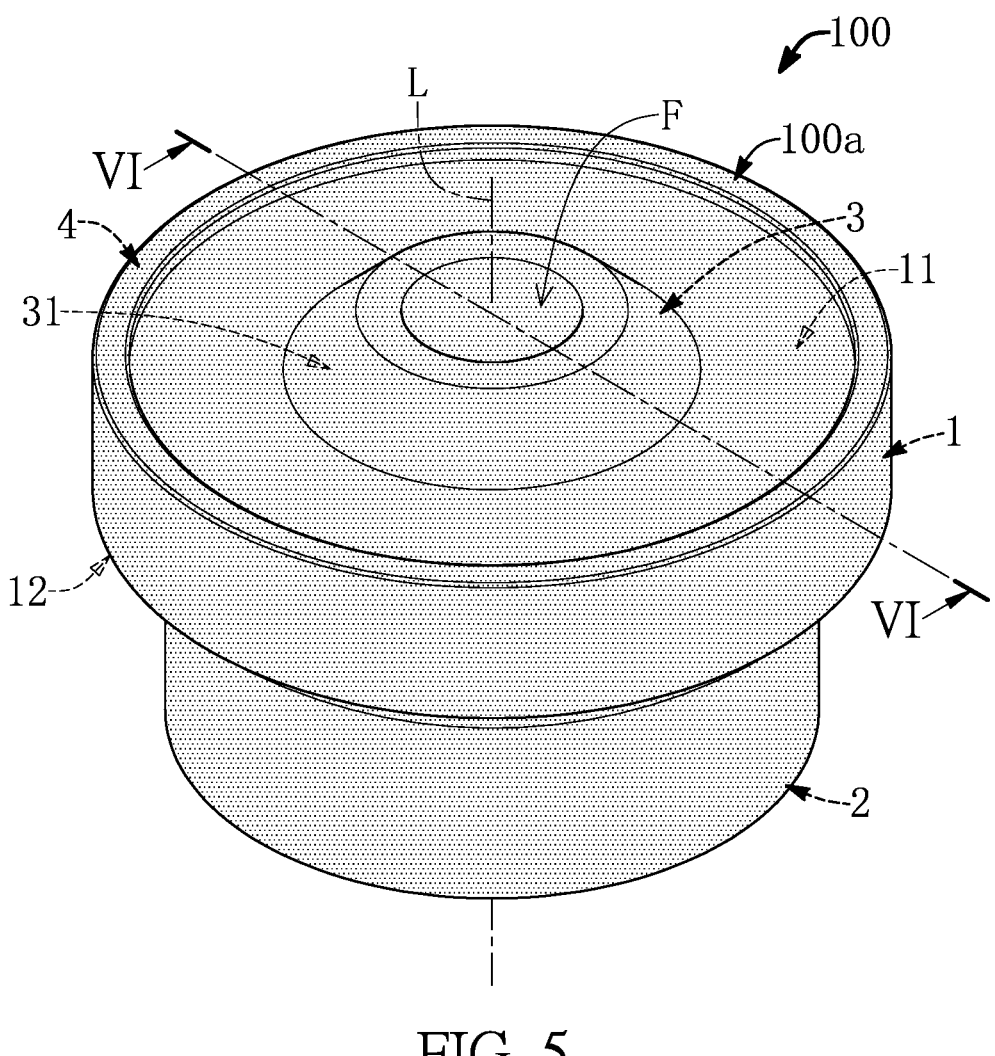
FIG. 5 is a perspective view of the nozzle having an inner engagement structure according to the first embodiment of the present disclosure.
Figure 6:
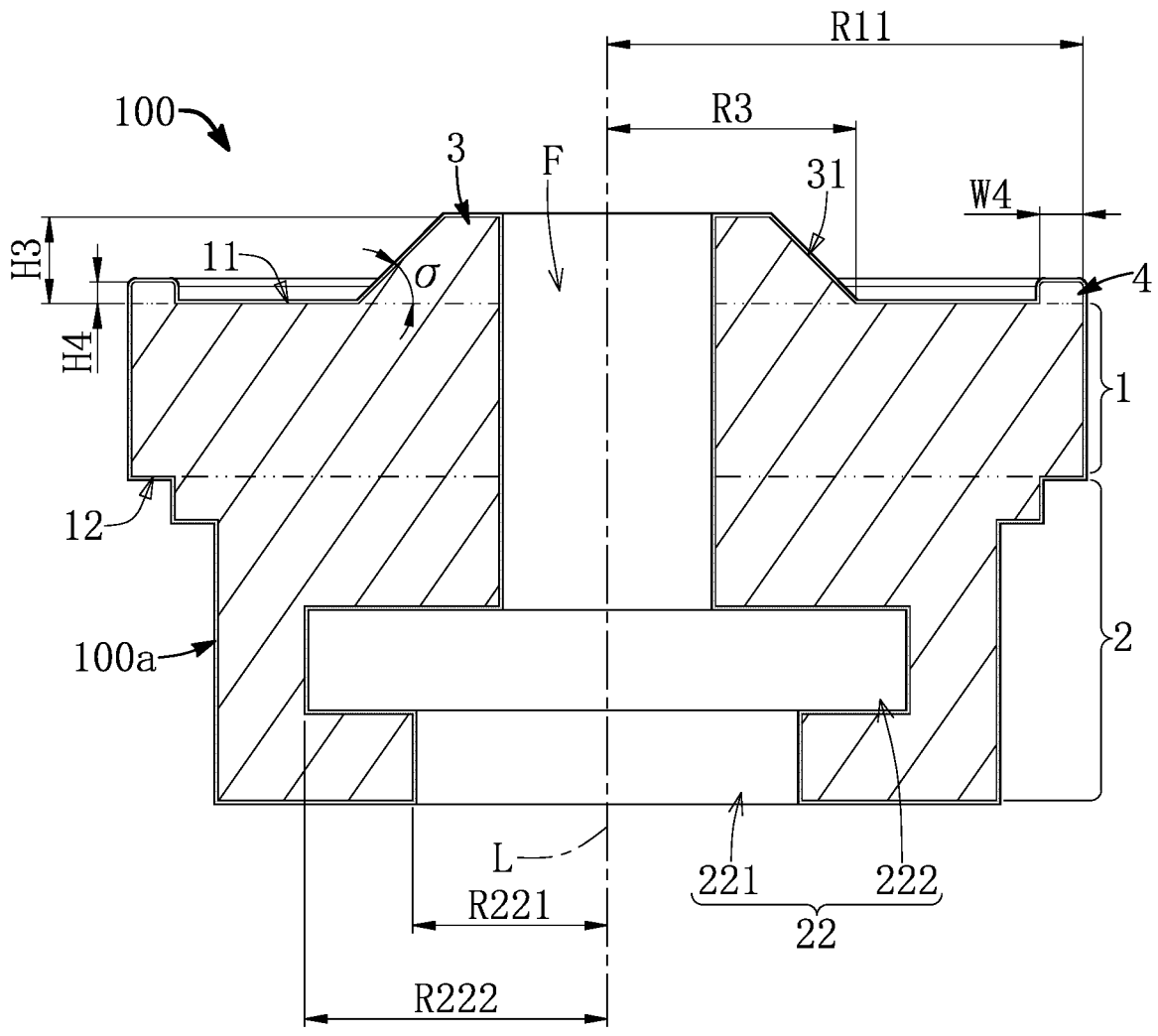
FIG. 6 is a cross-sectional view taken along line VI-VI of FIG. 5.
Figure 7:
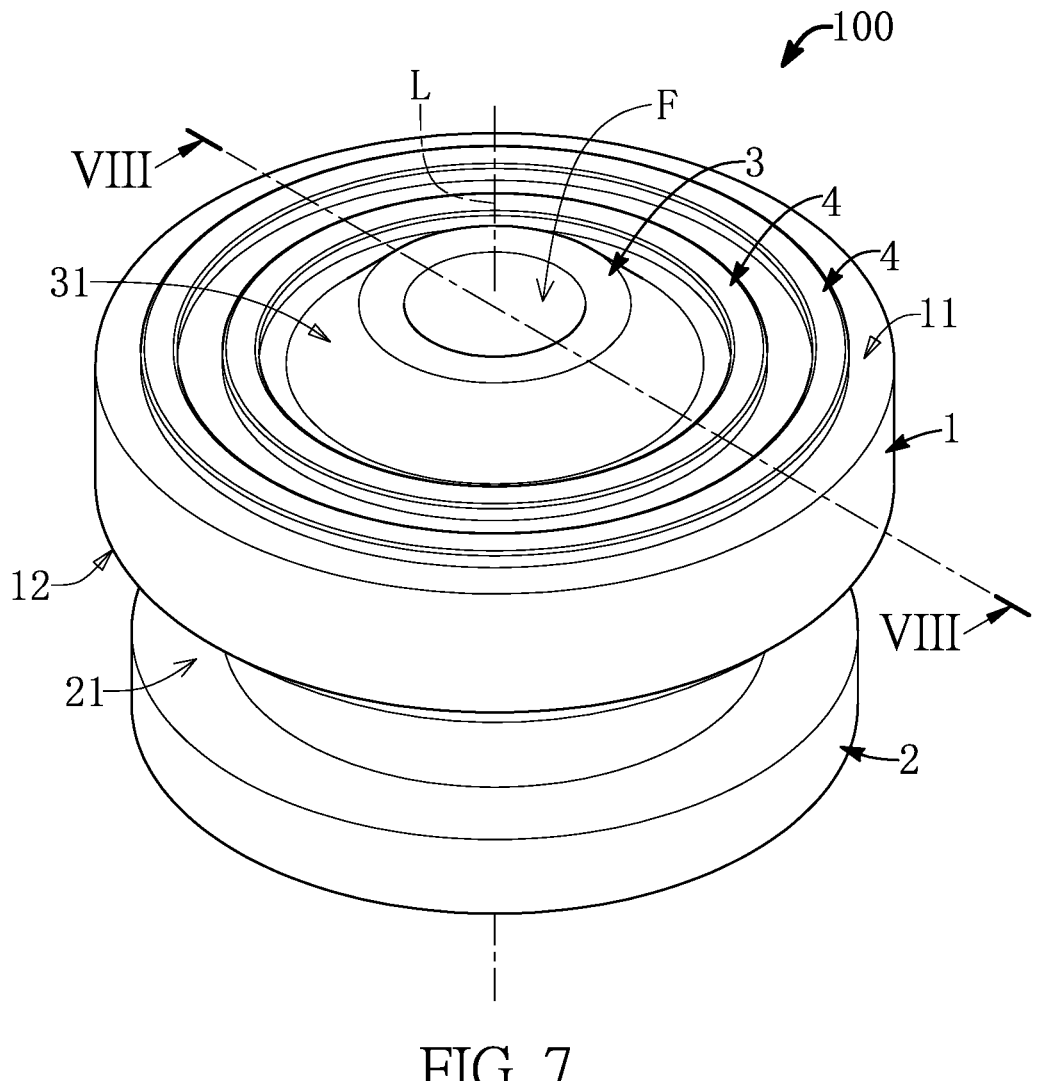
FIG. 7 is a perspective view of the nozzle having the outer engagement structure according to a second embodiment of the present disclosure.
Figure 8:
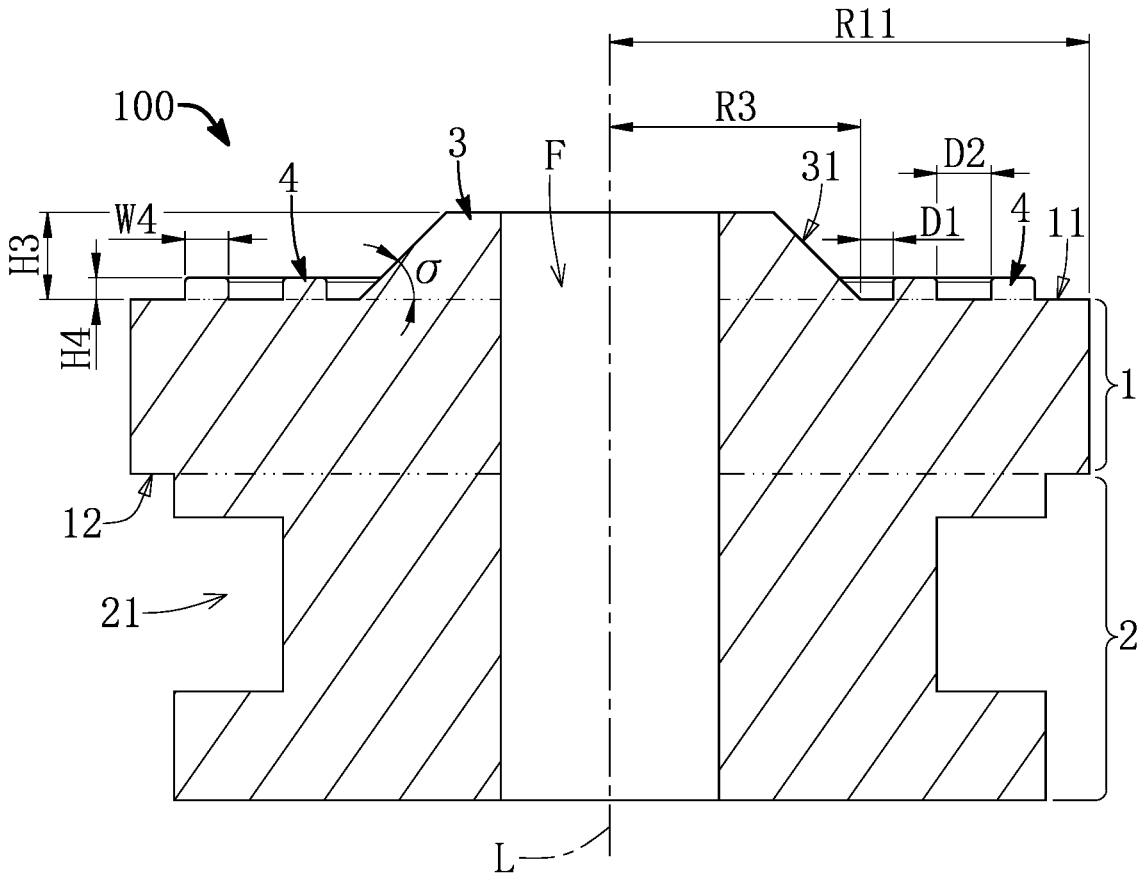
FIG. 8 is a cross-sectional view taken along line VIII-VIII of FIG. 7.
Figure 9:
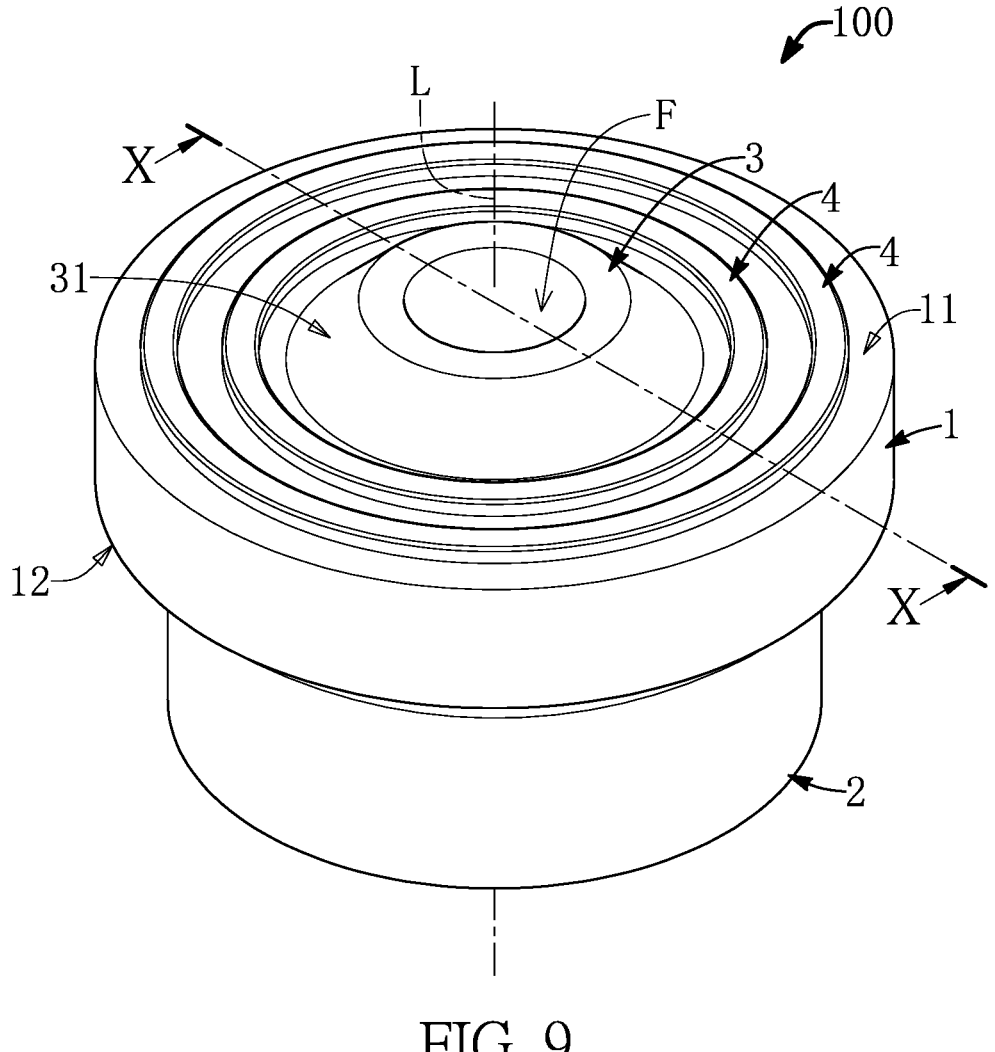
FIG. 9 is a perspective view of the nozzle having the inner engagement structure according to the second embodiment of the present disclosure.
Figure 10:
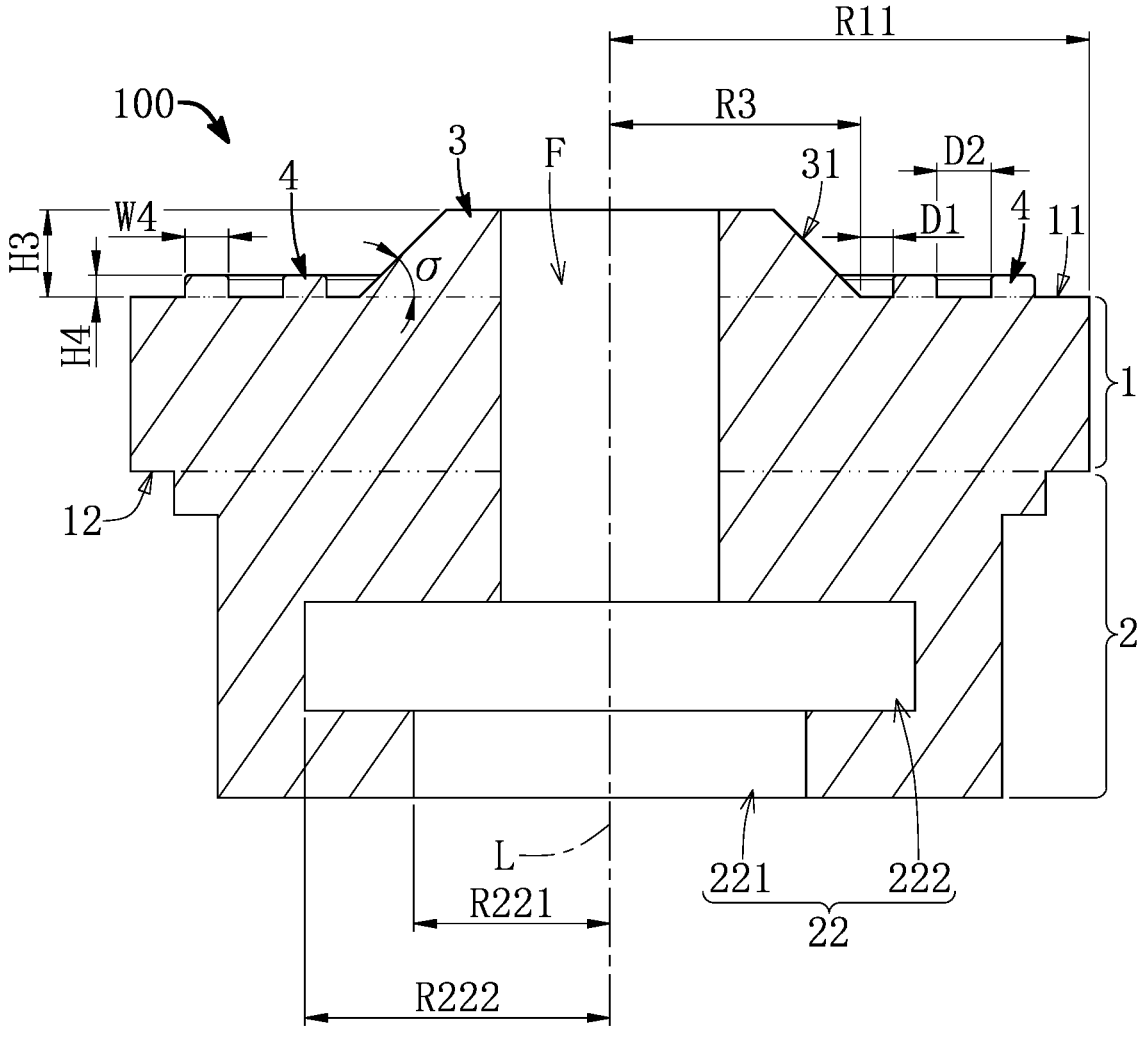
FIG. 10 is a cross-sectional view taken along line X-X of FIG. 9.
Figure 11:
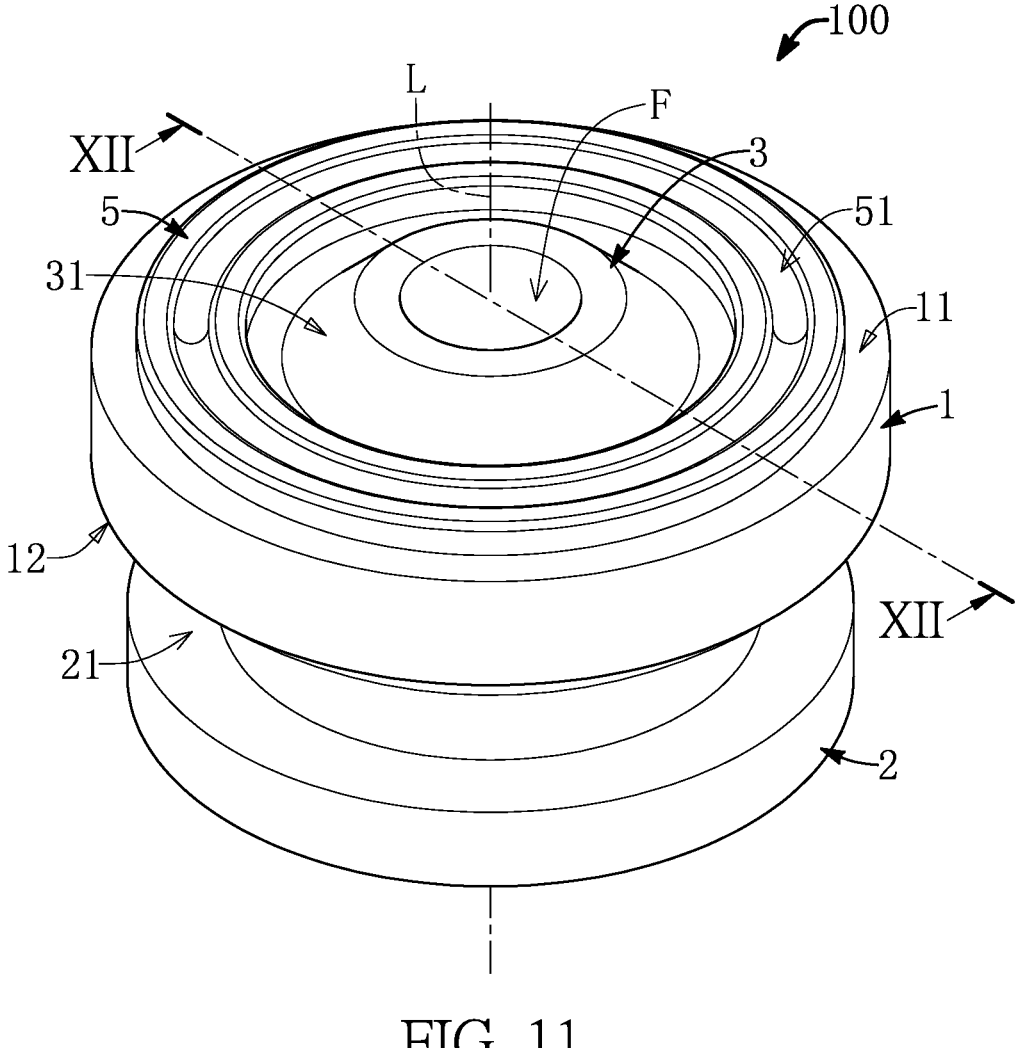
FIG. 11 is a perspective view of the nozzle having the outer engagement structure according to a third embodiment of the present disclosure.
Figure 12:
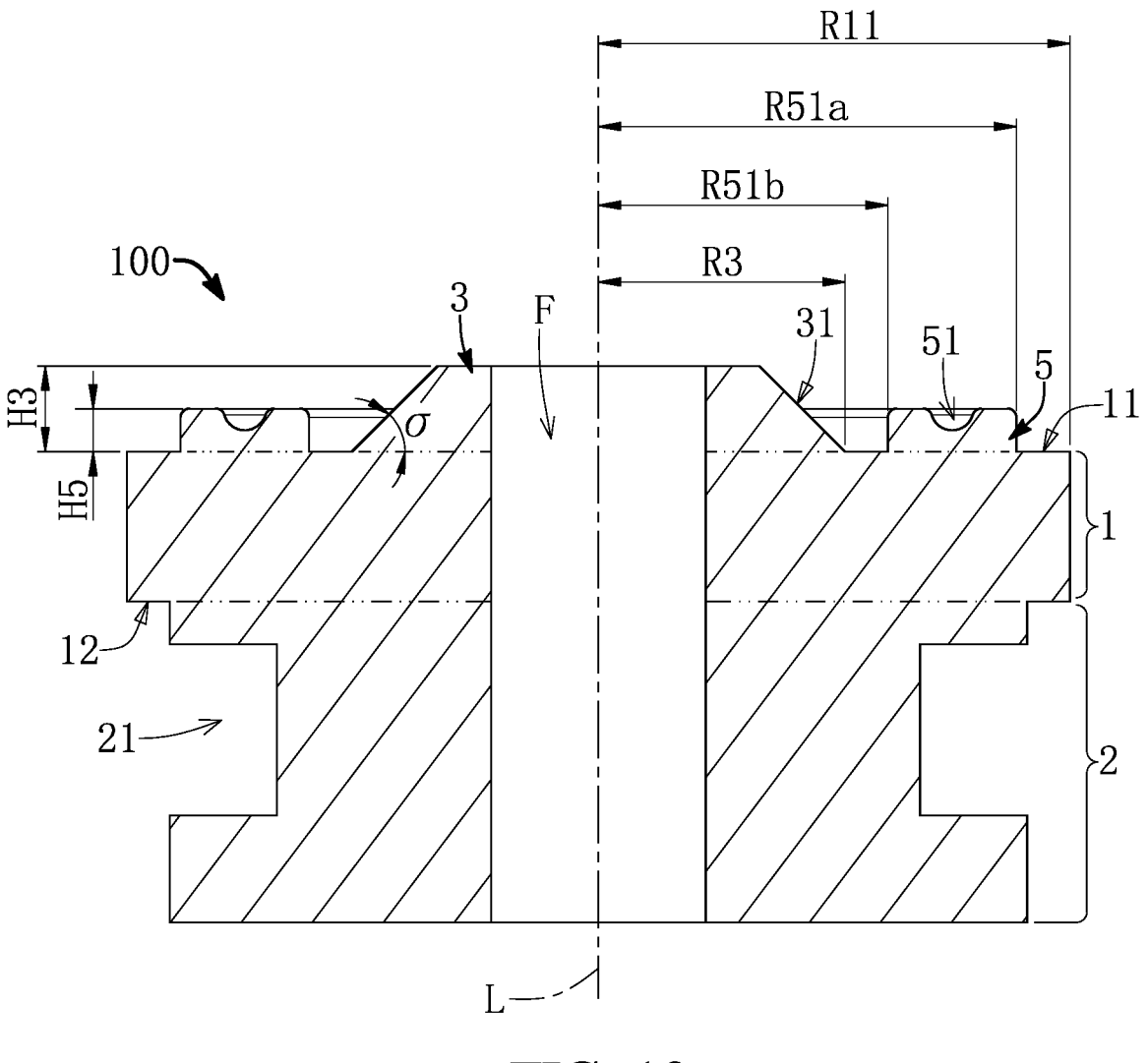
FIG. 12 is a cross-sectional view taken along line XII-XII of FIG. 11.
Figure 13:
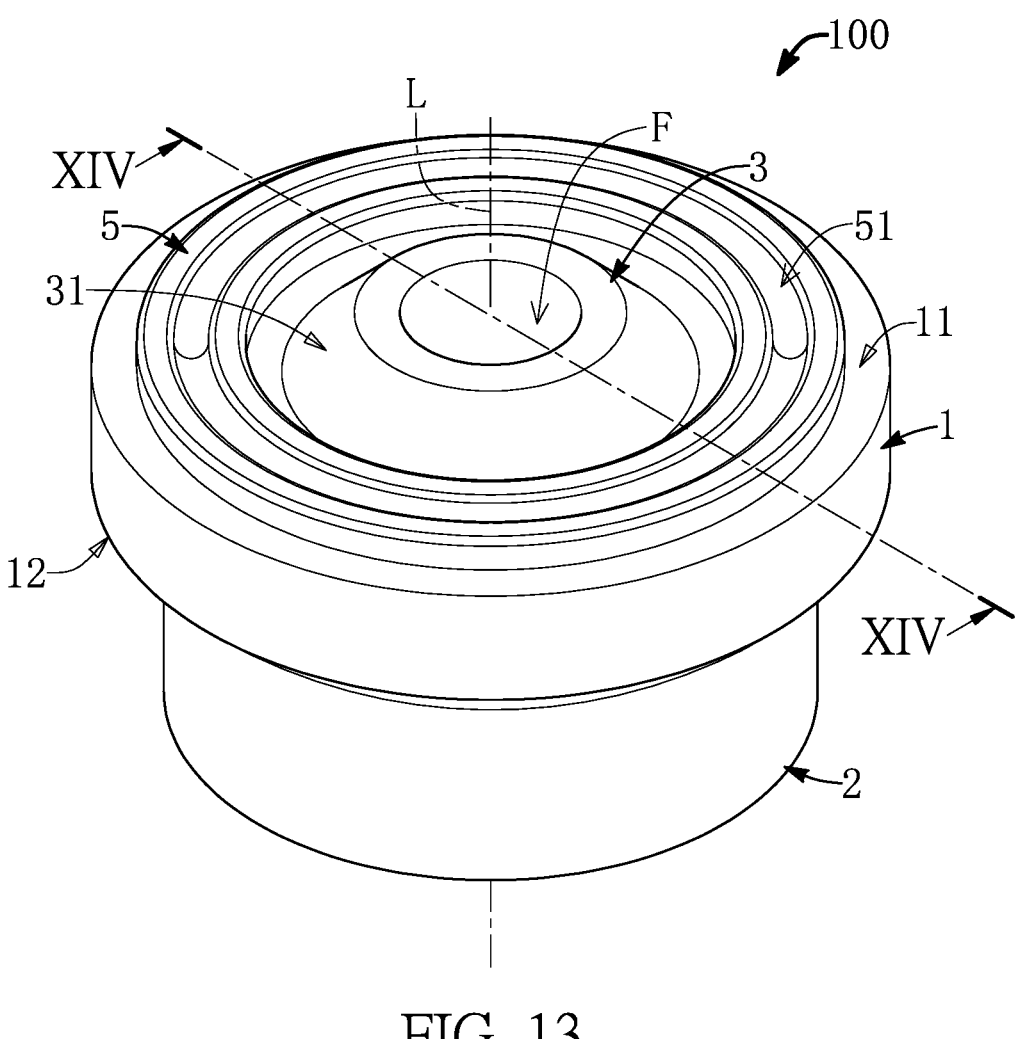
FIG. 13 is a perspective view of the nozzle having the inner engagement structure according to the third embodiment of the present disclosure.
Figure 14:
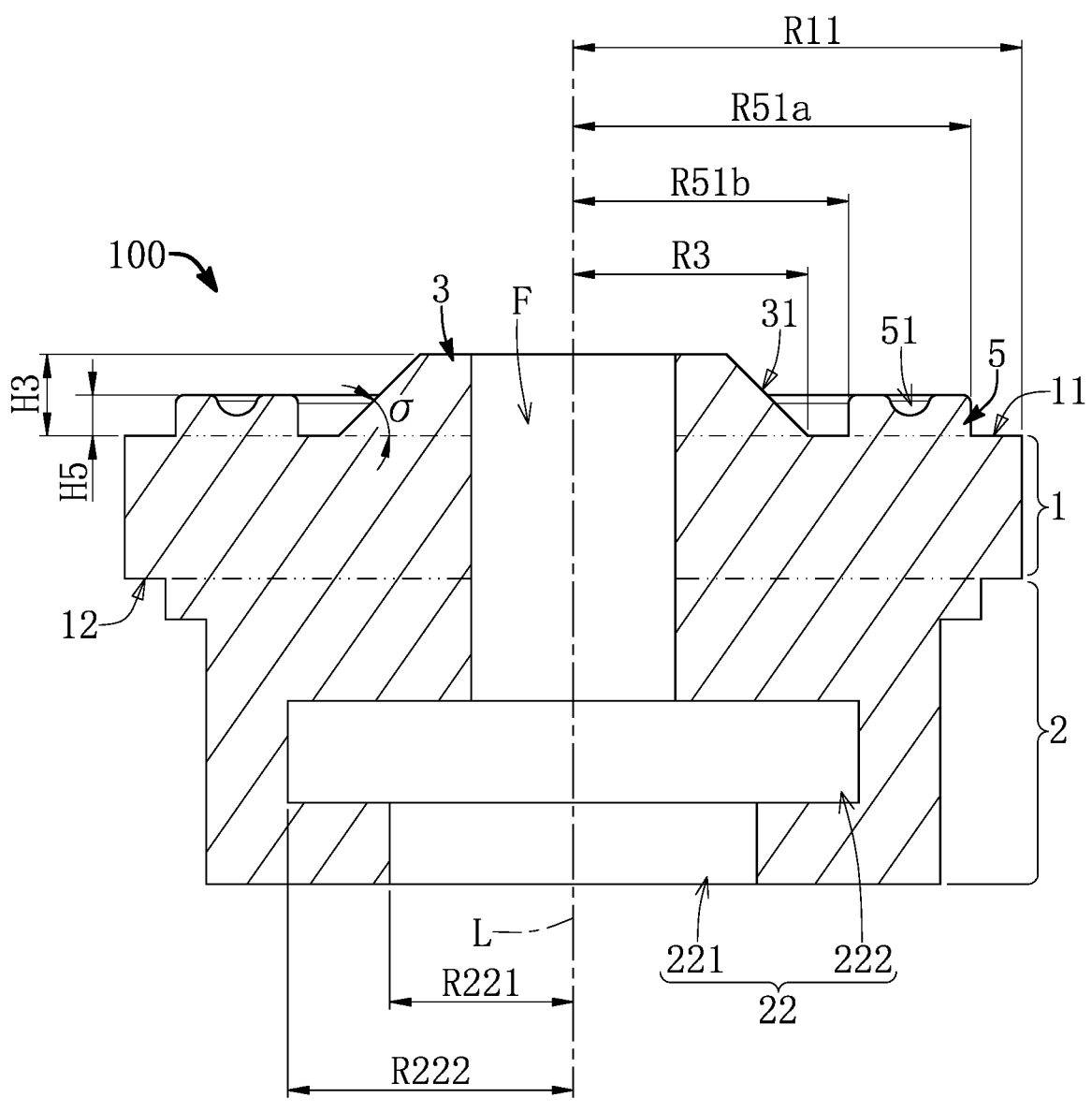
FIG. 14 is a cross-sectional view taken along line XIV-XIV of FIG. 13.

As shown in FIG. 5 and FIG. 6, the nozzle 100 in the present embodiment can have a coating layer 100a (e.g., a transparent insulating layer having uniform thickness) formed on an outer surface thereof, wherein the coating layer 100a is made of parylene (e.g., Poly-p-xylylene). Specifically, active molecules of the coating layer 100a have good penetrating effect, so that an inner portion, a bottom portion, and a peripheral portion of the nozzle 100 can be formed in a non-porous structure. Accordingly, the coating layer 100a can provide the nozzle 100 with complete high-quality protection against acid, alkali, salt spray, mold, and various corrosive attacks. Furthermore, if the coating layer 100a is in a nano-scale, the coating layer 100a can inhibit the adhesion of fine particles, but the present disclosure is not limited thereto. For example, in other embodiments of the present disclosure not shown in the drawings, the nozzle 100 can be provided without the coating layer 100a; or, the coating layer 100a can be made of other materials.

Figure 3:
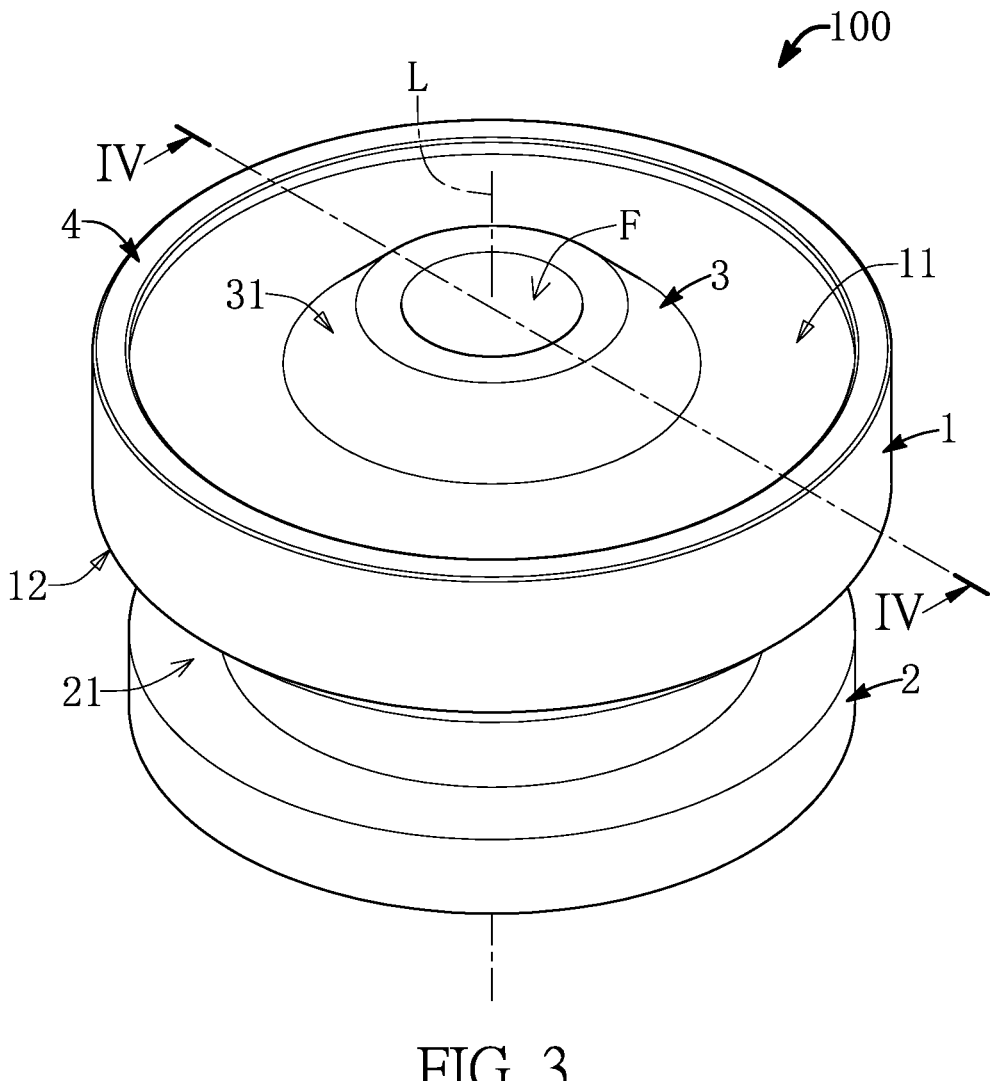
FIG. 3 is a perspective view of the nozzle having an outer engagement structure according to the first embodiment of the present disclosure.
Figure 4:
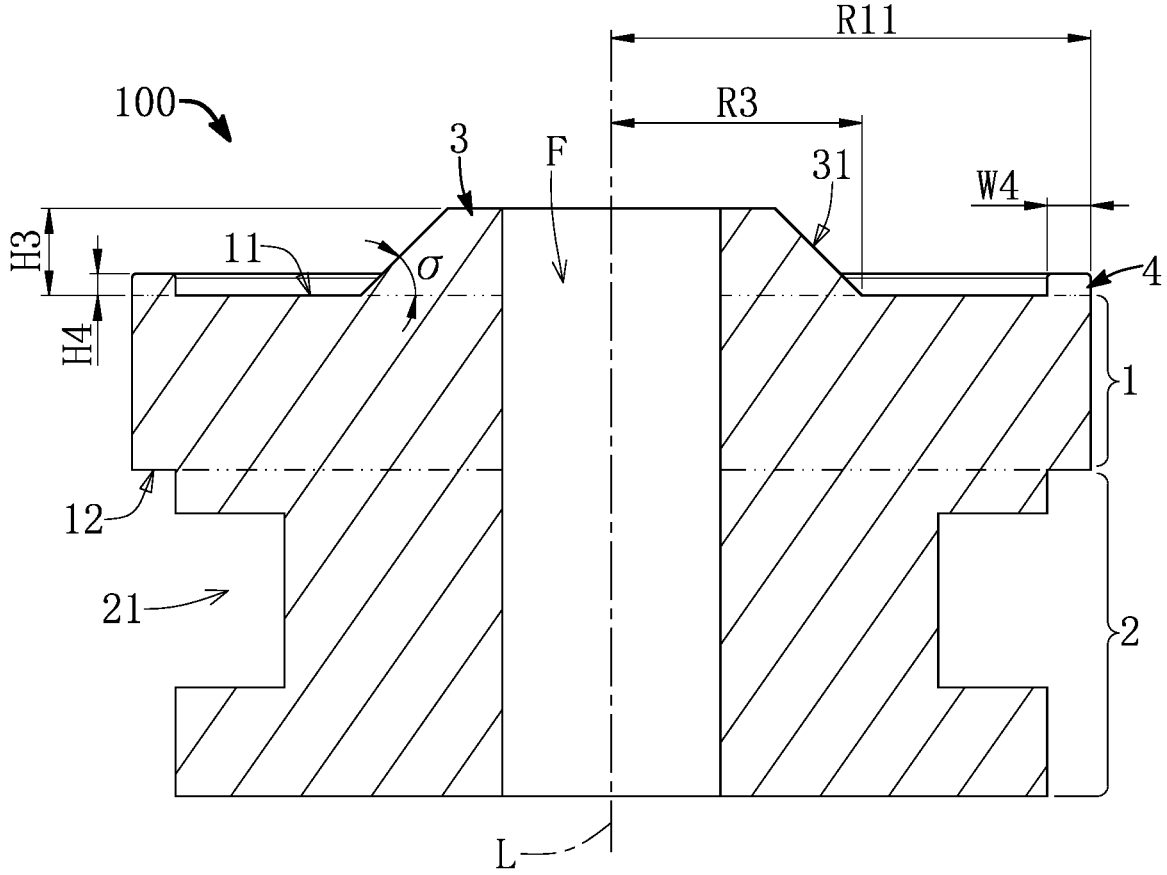
FIG. 4 is a cross-sectional view taken along line IV-IV of FIG. 3.

Moreover, as shown in FIG. 3 and FIG. 4, the nozzle 100 defines a central axis L, and includes a carrying segment 1, an assembling segment 2, a conical frustum segment 3, and a ring-shaped rib 4. The assembling segment 2 and the conical frustum segment 3 are respectively connected to two opposite sides of the carrying segment 1, and the ring-shaped rib 4 surrounds the conical frustum segment 3. The conical frustum segment 3, the carrying segment 1, and the assembling segment 2 jointly define an airflow channel F penetrating therethrough along the central axis L. In the present embodiment, each of the carrying segment 1 and the assembling segment 2 is substantially a cylinder structure, a thickness of the assembling segment 2 is greater than that of the carrying segment 1, and a maximum outer diameter of the assembling segment 2 is less than that of the carrying segment 1, but the present disclosure is not limited thereto.

It should be noted that the assembling segment 2 of the nozzle 100 can be formed with an outer engagement structure (shown in FIG. 3 and FIG. 4) or an inner engagement structure (shown in FIG. 5 and FIG. 6) according to design requirements. As shown in FIG. 3 and FIG. 4, the assembling segment 2 of the nozzle 100 has an outer ring-shaped groove 21 recessed in the outer surface thereof for being assembled to the load port 200. Or, as shown in FIG. 6, the assembling segment 2 of the nozzle 100 has an inner ring-shaped groove 22 that is recessed in an inner surface thereof and that is in spatial communication with the airflow channel F for being assembled to the load port 200.

Specifically, as shown in FIG. 6, the inner ring-shaped groove 22 includes a first groove 221 and a second groove 222 that are sequentially recessed from a bottom edge of the assembling segment 2. The first groove 221 and the second groove 222 are in spatial communication with each other, and each of the first groove 221 and the second groove 222 is in spatial communication with the airflow channel L. Moreover, a first radius 8221 of the first groove 221 is less than a second radius 8222 of the second groove 222, but the present disclosure is not limited thereto.

The carrying segment 1 has a top side 11 and a bottom side 12 that is opposite to the top side 11. The assembling segment 2 extends from the bottom side 12 of the carrying segment 1, and the conical frustum segment 3 tapers gradually from the top side 11 of the carrying segment 1 along a direction away from the assembling segment 2. In the present embodiment, the conical frustum segment 3 is connected to a central portion of the top side 11 of the carrying segment 1, and any cross section of the conical frustum segment 3 perpendicular to the central axis L has a center that is located at the central axis L. In other words, the central axis L of the present embodiment can be defined by the conical frustum segment 3.

Specifically, a surrounding lateral surface 31 of the conical frustum segment 3 has a maximum radius R3 that is greater than the first radius R221 and that is less than the second radius R222, and the surrounding lateral surface 31 of the conical frustum segment 3 and a plane perpendicular to the central axis L have an angle σ therebetween that is within a range from 35 degrees to 70 degrees. Moreover, the angle σ is preferably within a range from 45 degrees to 60 degrees.

Figure 2:
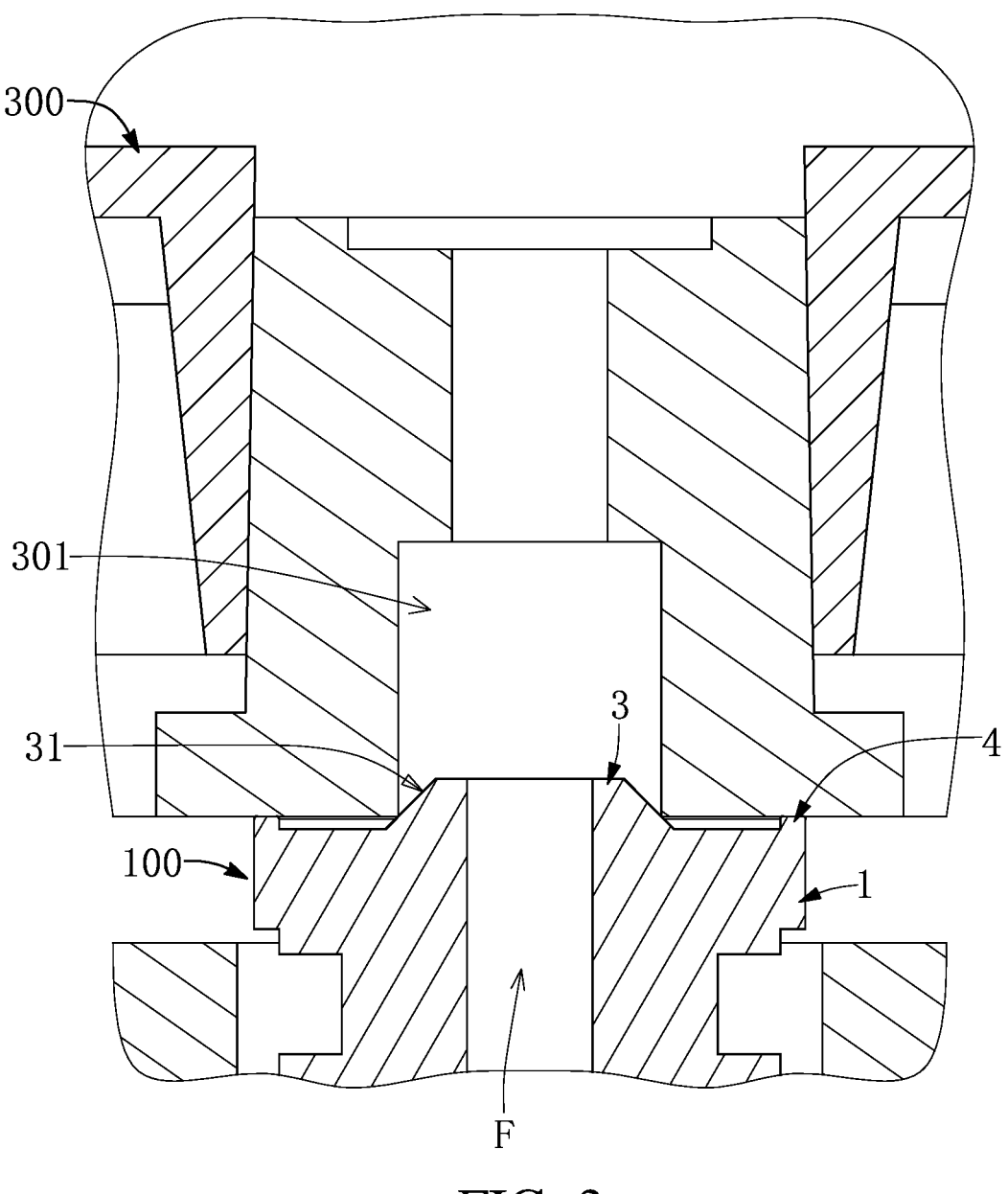
FIG. 2 is a cross-sectional view showing a connection relationship between the wafer cassette and one of the nozzles according to the first embodiment of the present disclosure.

As shown in FIG. 2, when the wafer cassette 300 is disposed on the nozzle 100, the conical frustum segment 3 of the nozzle 100 is engaged into a gas hole 301 of the wafer cassette 300 through specific structural conditions (e.g., the angle σ is within a range from 35 degrees to 70 degrees), such that the surrounding lateral surface 31 of the conical frustum segment 3 can be tightly abutted against an inner wall surrounding the gas hole 301 for preventing gas leakage from the nozzle 100. Accordingly, an airtight effect between the nozzle 100 and the wafer cassette 300 can be effectively improved. In addition, the gas hole 301 can be a gas-input hole or a gas-output hole of the wafer cassette 300 or the mask cassette (not shown), but the present disclosure is not limited thereto.

The ring-shaped rib 4 is formed on the top side 11 of the carrying segment 1 and has a center located at the central axis L. Moreover, an outer edge of the ring-shaped rib 4 is flush with an outer edge of the carrying segment 1. Specifically, the outer edge of the carrying segment 1 defines a radius R11 with respect to the central axis L, and a width W4 of the ring-shaped rib 4 is 5% to 18% of the radius R11. Furthermore, along a direction parallel to the central axis L, a height H3 of the conical frustum segment 3 is two times to six times of a height H4 of the ring-shaped rib 4, and a position of the conical frustum segment 3 in contact with the gas hole 301 is substantially coplanar with a top edge of the ring-shaped rib 4.

Accordingly, the ring-shaped rib 4 of the nozzle 100 having specific structural conditions (e.g., the width W4 and the height H4) can be tightly abutted against a portion of the wafer cassette 300 surrounding the gas hole 301, thereby preventing gas leakage from the nozzle 100 and further improving the airtight effect between the nozzle 100 and the wafer cassette 300. As a result, gas leakage from the nozzle 100 can be effectively avoided because of the synergy of the conical frustum segment 3 and the ring-shaped rib 4.

Second Embodiment

Referring to FIG. 7 to FIG. 10, a second embodiment of the present disclosure is provided, which is similar to the first embodiment of the present disclosure. For the sake of brevity, descriptions of the same components in the first and second embodiments of the present disclosure (e.g., the carrying segment 1, the assembling segment 2, and the conical frustum segment 3) will be omitted herein, and the following description only discloses different features between the first and second embodiments.

In the present embodiment, the nozzle 100 further includes a plurality of ring-shaped ribs 4 formed on the top side 11 and surrounding the conical frustum segment 3. The ring-shaped ribs 4 are spaced apart from each other, and centers of the ring-shaped ribs 4 are located at the central axis L. Moreover, the conical frustum segment 3 and one of the ring-shaped ribs 4 adjacent thereto have a distance D1 therebetween that is less than a distance D2 between any two of the ring-shaped ribs 4 adjacent to each other, and an outer edge of any one of the ring-shaped ribs 4 in the present embodiment is spaced apart from an outer edge of the carrying segment 1, but the present disclosure is not limited thereto. For example, in other embodiments of the present disclosure not shown in the drawings, the nozzle 100 can further include one additional ring-shaped rib having an outer edge flush with the outer edge of the carrying segment 1.

In the present embodiment, heights H4 of the ring-shaped ribs 4 are substantially the same, and widths W4 of the ring-shaped ribs 4 are substantially the same. Moreover, along a direction parallel to the central axis L, a height H3 of the conical frustum segment 3 is two times to six times of the height H4 of any one of the ring-shaped ribs 4. When the wafer cassette (not shown) is disposed on the nozzle 100, the conical frustum segment 3 of the nozzle 100 can be engaged into a gas hole of the wafer cassette, and a position of the conical frustum segment 3 in contact with the gas hole is substantially coplanar with a top edge of any one of the ring-shaped ribs 4. Compared to the first embodiment, more ring-shaped ribs 4 of the present embodiment can further ensure the avoidance of gas leakage from the nozzle 100.

Third Embodiment

Referring to FIG. 11 to FIG. 15, a third embodiment of the present disclosure is provided, which is similar to the first embodiment of the present disclosure. For the sake of brevity, descriptions of the same components in the first and third embodiments of the present disclosure (e.g., the carrying segment 1, the assembling segment 2, and the conical frustum segment 3) will be omitted herein, and the following description only discloses different features between the first and third embodiments.

In the present embodiment, the nozzle 100 further includes at least one ring-shaped protrusion 5 formed on the top side 11 and surrounding the conical frustum segment 3. It should be noted that a quantity of the at least one ring-shaped protrusion 5 in the present embodiment is one for example, and the ring-shaped protrusion 5 described in the present embodiment can also be referred to the ring-shaped rib 5. The ring-shaped protrusion 5 has a ring-shaped trench 51 recessed in a top edge thereof, and a center of the ring-shaped protrusion 5 and a center of the ring-shaped trench 51 are located at the central axis L. Along a direction parallel to the central axis L, a height H3 of the conical frustum segment 3 is two times to six times of a height H5 of the ring-shaped protrusion 5. Moreover, when the wafer cassette (not shown) is disposed on the nozzle 100, the conical frustum segment 3 of the nozzle 100 can be engaged into a gas hole of the wafer cassette, and a position of the conical frustum segment 3 in contact with the gas hole is substantially coplanar with a top edge of the ring-shaped protrusion 5.

Figure 15:
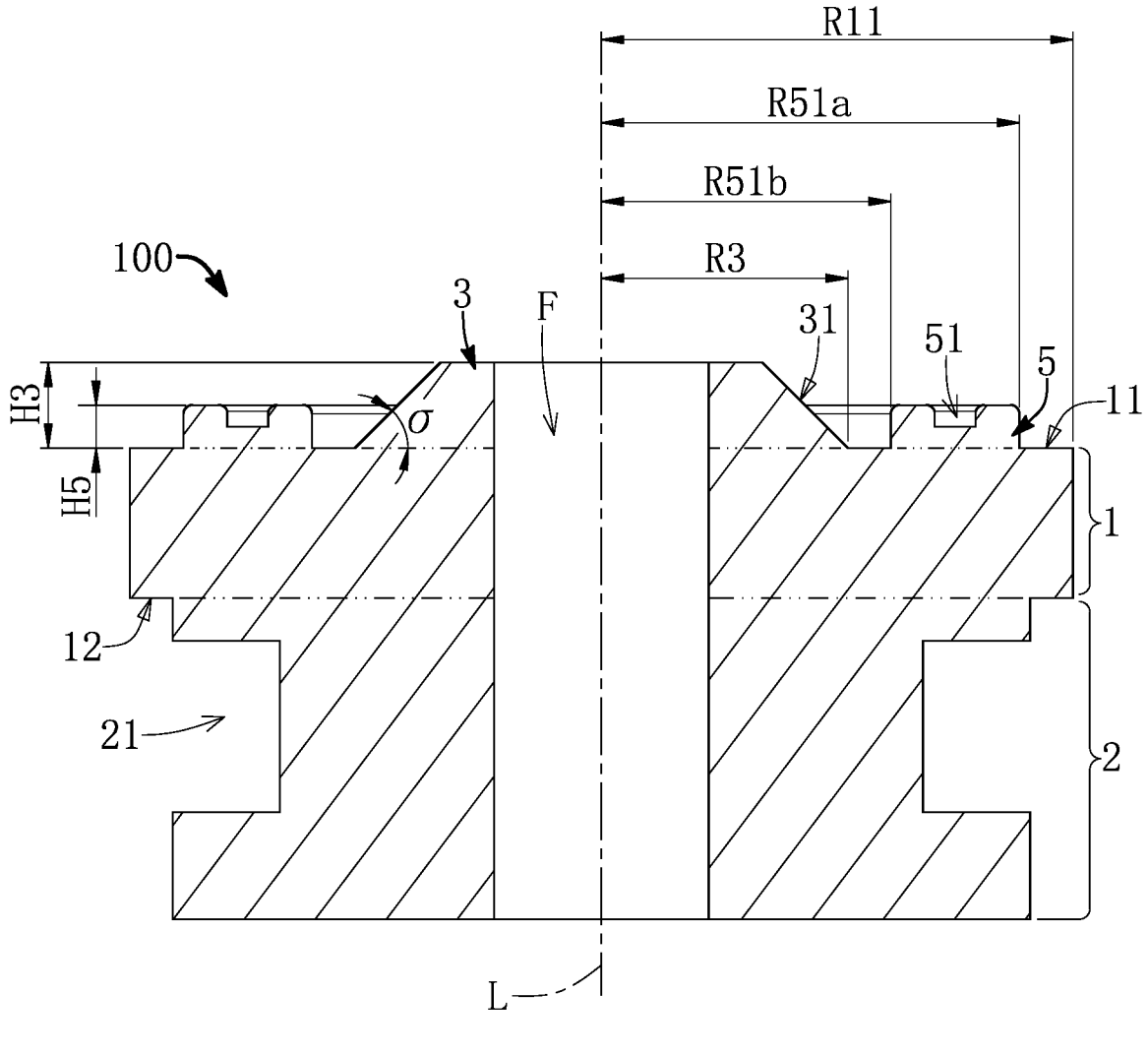
FIG. 15 is a cross-sectional view showing the nozzle of FIG. 12 in another configuration.

Specifically, on the top edge of the ring-shaped protrusion 5, a specific value defined by a maximum radius R51$a$ of the ring-shaped protrusion 5 divided by a minimum radius R51$b$ of the ring-shaped protrusion 5 is within a range from 1.1 to 1.5. Further, a width of the ring-shaped trench 51 gradually decreases along a direction away from the top edge of the ring-shaped protrusion 5, and a depth of the ring-shaped trench 51 does not reach the top side 11 of the carrying segment 1, but the present disclosure is not limited thereto. For example, as shown in FIG. 15, the width of the ring-shaped trench 51 is unchanged along a direction away from the top edge of the ring-shaped protrusion 5, and the depth of the ring-shaped trench 51 does not reach the top side 11 of the carrying segment 1; or, in other embodiments of the present disclosure not shown in the drawings, the depth of the ring-shaped trench 51 can be provided to extend past the top side 11 of the carrying segment 1. As a result, gas leakage from the nozzle 100 can be effectively avoided because of the synergy of the conical frustum segment 3 and the ring-shaped protrusion 5.

Beneficial Effects of the Embodiments

In conclusion, the conical frustum segment of the nozzle provided by the present disclosure can be engaged into a gas hole of a wafer cassette or a mask cassette through specific structural conditions (e.g., the angle being within a range from 35 degrees to 70 degrees), such that the surrounding lateral surface of the conical frustum segment is tightly abutted against an inner wall surrounding the gas hole for preventing gas leakage from the nozzle. Accordingly, the airtight effect between the nozzle and the wafer cassette (or the mask cassette) can be effectively improved. Furthermore, gas leakage from the nozzle can be effectively avoided because of the synergy of the conical frustum segment and the at least one ring-shaped rib provided by the present disclosure.

Moreover, the ring-shaped rib of the nozzle of the present disclosure provided with specific structural conditions can be tightly abutted against a portion of the wafer cassette or the mask cassette surrounding the gas hole, thereby preventing gas leakage from the nozzle and further improving the airtight effect between the nozzle and the wafer cassette (or the mask cassette). In addition, the airtight effect between the nozzle and the wafer cassette (or the mask cassette) in the present disclosure can be further improved through the ring-shaped trench formed on the ring-shaped protrusion.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A nozzle, comprising:
a carrying segment having a top side and a bottom side that is opposite to the top side;
an assembling segment extending from the bottom side of the carrying segment;
a conical frustum segment tapering from the top side of the carrying segment along a direction away from the assembling segment, wherein the conical frustum segment defines a central axis, and a surrounding lateral surface of the conical frustum segment and a plane perpendicular to the central axis have an angle therebetween that is within a range from 35 degrees to 70 degrees; and
at least one ring-shaped rib formed on the top side of the carrying segment and surrounding the conical frustum segment;
wherein the conical frustum segment, the carrying segment, and the assembling segment jointly define an airflow channel penetrating therethrough along the central axis;
wherein the at least one ring-shaped rib has a ring-shaped trench recessed in a top edge thereof, and wherein, along a direction parallel to the central axis, a height of the conical frustum segment is two times to six times of a height of the at least one ring-shaped rib.

2. The nozzle according to claim 1, wherein an outer edge of the at least one ring-shaped rib is flush with an outer edge of the carrying segment.

3. The nozzle according to claim 1, wherein the outer edge of the carrying segment defines a radius with respect to the central axis, and a width of the at least one ring-shaped rib is 5% to 18% of the radius.

4. The nozzle according to claim 1, wherein a quantity of the at least one ring-shaped rib is more than one, wherein the ring-shaped ribs are spaced apart from each other, and centers of the ring-shaped ribs are located at the central axis, and wherein, along a direction parallel to the central axis, a height of the conical frustum segment is two times to six times of a height of any one of the ring-shaped ribs.

5. The nozzle according to claim 4, wherein the conical frustum segment and one of the ring-shaped ribs adjacent thereto have a distance therebetween that is less than a distance between any two of the ring-shaped ribs adjacent to each other.

6. The nozzle according to claim 1, wherein the ring-shaped trench has a width that gradually decreases along a direction away from the top edge of the at least one ring-shaped rib, and a depth of the ring-shaped trench does not reach the top side of the carrying segment.

7. The nozzle according to claim 1, wherein the ring-shaped trench has a constant width along a direction away from the top edge of the at least one ring-shaped rib, and a depth of the ring-shaped trench does not reach the top side of the carrying segment.

8. The nozzle according to claim 1, wherein a center of the at least one ring-shaped rib and a center of the ring-shaped trench are located at the central axis, and wherein, on the top edge of the at least one ring-shaped rib, a specific value defined by a maximum radius of the at least one ring-shaped rib divided by a minimum radius of the at least one ring-shaped rib is within a range from 1.1 to 1.5.

9. The nozzle according to claim 1, wherein the assembling segment has an outer ring-shaped groove recessed in an outer surface thereof, for being assembled to a load port.

10. The nozzle according to claim 1, wherein the assembling segment has an inner ring-shaped groove that is recessed in an inner surface thereof and that is in spatial communication with the airflow channel, for being assembled to a load port.

11. The nozzle according to claim 10, wherein the inner ring-shaped groove includes a first groove and a second groove that are sequentially recessed from a bottom edge of the assembling segment that is arranged away from the conical frustum segment, and wherein a first radius of the first groove is less than a second radius of the second groove.

12. The nozzle according to claim 11, wherein a maximum radius of the surrounding lateral surface of the conical frustum segment is greater than the first radius and is less than the second radius.

13. The nozzle according to claim 1, wherein the nozzle has an inherently one-piece structure made of a polymer material, and a Shore hardness of the nozzle is within a range from 18 to 22.

14. The nozzle according to claim 13, wherein the polymer material is a silicone.

15. The nozzle according to claim 13, further comprising a coating layer formed on an outer surface thereof, wherein the coating layer is made of parylene.

16. The nozzle according to claim 1, wherein the conical frustum segment is configured to be engaged in a gas hole of a wafer cassette or a mask cassette, and the surrounding lateral surface of the conical frustum segment is abutted against an inner wall surrounding the gas hole.

* * * * *